United States Patent
Yamaguchi

[11] Patent Number: 6,046,907
[45] Date of Patent: Apr. 4, 2000

[54] HEAT CONDUCTOR

[75] Inventor: Akio Yamaguchi, Nagoya, Japan

[73] Assignee: Kitigawa Industries Co., Ltd., Aichi-Ken, Japan

[21] Appl. No.: 09/398,656

[22] Filed: Sep. 16, 1999

[30] Foreign Application Priority Data

Sep. 17, 1998 [JP] Japan .................................. 10-263084

[51] Int. Cl.[7] .................................................. H05K 7/20
[52] U.S. Cl. .......................... 361/704; 361/705; 361/706; 361/707; 361/708; 361/709; 361/710; 257/706; 257/707; 257/713; 257/717; 257/720; 174/16.3; 165/80.3; 165/185; 156/145; 156/148; 156/182; 156/185; 428/615; 428/620; 428/621; 428/622; 428/623; 428/625; 428/36.2
[58] Field of Search ..................... 361/704–710, 361/712, 713, 746; 257/675, 706, 707, 717, 720; 174/16.3; 165/80.3, 185; 156/145, 148, 182, 185; 428/615–618, 620–626

[56] References Cited

U.S. PATENT DOCUMENTS

| | | |
|---|---|---|
| 4,602,678 | 7/1986 | Fick . |
| 4,685,987 | 8/1987 | Fick . |
| 4,794,981 | 1/1989 | Mizuno .................................. 165/80.4 |
| 5,021,300 | 6/1991 | Stacey ..................................... 428/620 |
| 5,095,973 | 3/1992 | Toy ......................................... 165/185 |
| 5,164,885 | 11/1992 | Drye et al. ............................... 361/706 |
| 5,304,269 | 4/1994 | Jacaruso et al. ........................... 156/94 |
| 5,440,172 | 8/1995 | Sutrina ..................................... 257/712 |
| 5,591,034 | 1/1997 | Ameen et al. ............................. 439/91 |
| 5,602,720 | 2/1997 | Natsuhara et al. ....................... 361/708 |
| 5,741,579 | 4/1998 | Nishizawa ............................... 428/215 |
| 5,781,412 | 7/1998 | De Sorgo ................................. 361/704 |
| 5,783,862 | 7/1998 | Deeney ................................... 257/714 |
| 5,945,217 | 8/1999 | Hanrahan ............................... 428/389 |
| 5,950,066 | 9/1999 | Hanson et al. ........................... 428/551 |
| 5,962,348 | 10/1999 | Bootle et al. ............................ 442/265 |

FOREIGN PATENT DOCUMENTS 2728607 3/1998 Japan .

*Primary Examiner*—Leo P. Picard
*Assistant Examiner*—Boris Chervinsky
*Attorney, Agent, or Firm*—Davis and Bujold

[57] ABSTRACT

A heat conductor used by being disposed between a heat sink and electronic parts mounted on a printed circuit board. The heat conductor is layered by a heat conductive layer, made of silicone gel with alumina as a heat conductive filler dispersed therein, and a potentially adhesive layer. The potentially adhesive layer consists of a hot melt layer, with alumina as a heat conductive filler dispersed therein, and a heat resistant film, to facilitate formation of the hot melt layer, adhered to the heat conductive layer on one face of the heat resistant film. The heat conductor is set on the electronic parts so that the potentially adhesive layer abuts them, and is made to adhere to the electronic parts due to heating by means of reflow soldering to reach the phase change temperature of the adhesive.

8 Claims, 4 Drawing Sheets

HEAT CONDUCTOR

TECHNICAL FIELD OF THE INVENTION

The invention is related to a heat conductor for accelerating heat dissipation from exothermic bodies like electronic parts or heated bodies heated by the same.

BACKGROUND OF THE INVENTION

Recently, electronic parts such as an IC's and the like used in an electronic instruments have become more integrated and operate at higher clock speeds, which increases the electricity consumption and heat generation. This is one cause of misoperation of the electronic instrument and failure of the electronic parts themselves and heat dissipation of those electronic parts is now a major concern.

Heretofore, a heat sink made of a metal plate with high heat conductivity, such as brass and the like, has been used in an electronic instrument, in order to suppress temperature rise of the electric instrument during use.

The heat sink conducts the heat generated from the electronic parts and dissipates the heat from its surface by the temperature difference between the surface and the outside atmosphere. In order to efficiently conduct the heat from the electronic parts to the heat sink, it is necessary for the heat sink to closely contact the electronic parts. Because of differences in height among the electronic parts and tolerances in the assembly, soft heat-conductive sheets are disposed between respective electronic parts and the heat sink to attain good heat conduction from the electronic parts to the heat sink via the heat-conductive sheets. For example, one side of a heat conductive sheet made of heat-conductive silicone rubber and the like is made to adhere closely to each electronic part, and the other side is made to closely contact with a metal plate, for example a box panel, a common heat sink.

The aforementioned heat conductive sheet, which is to be applied to an electronic part on a printed circuit board in an assembly line, cannot be automatically mounted but is applied to the printed circuit board by hand.

The reason why the heat conducive sheet cannot be automatically mounted is that the heat conductive sheet has adhesive for adhering to the parts. An attempt at automatic mounting may cause the heat conductive sheet to adhere to the automatic mounting reel and the like. Usually, the adhesive surface of a heat conductive sheet is covered with a protective sheet. When mounting is performed by hand, the protective sheet is first peeled off and then the heat conductive sheet is applied. The peeling of the protective sheet will also hindered automatic mounting. When mounting is performed by hand, heat conductive sheets with various shapes, sizes and thicknesses need to be applied to the electronic parts. As the size of electronic parts is becoming smaller, the mounting work is becoming more troublesome and labor consuming.

SUMMARY OF THE INVENTION

A primary object of the invention is presented to solve the aforementioned problem and provide a heat conductor which can be mounted automatically.

The object of the invention is attained by providing a heat conductor comprising a heat conductive layer with heat conductive fillers dispersed in a base material having softness to enable close contact with parts to be abutted; and a potentially adhesive layer with heat conductive fillers dispersed therein, which is disposed integrally with the heat conductive layer and can adhere to parts to be abutted by changing its phase due to heating from the outside.

Specifically, in the heat conductor of the invention, there is provided a potentially adhesive layer disposed integrally with the heat conductive layer. By a phase change of the potentially adhesive layer due to heating from the outside, that is, by melting due to heating the potentially adhesive layer becomes adhesive and is made to adhere to parts to be abutted. The adhesive layer is subsequently solidified. Consequently, the heat conductive layer is adhered, via the potentially adhesive layer, to the parts abutted by the potentially adhesive layer and thus, the heat conductor is adhered to the parts abutted by the potentially adhesive layer. Here, "heating from the outside" includes, for example, heating by reflow soldering in which soldering of package parts is carried out by means of an outside heat source. In order to induce a phase change by heating, a material may be used which specifically shows a phase change at about 100° C. to about 150° C.

Therefore, when a heat conductor of the invention is set in such a way that the potentially adhesive layer abuts to electronic parts tentatively secured, for example, to a printed circuit board, before heating by reflow soldering and the like, the heat conductor is adhered to the electronic parts at the same time that automatic mounting of the electronic parts is performed. Moreover, if a heat conductor of the invention is set on each electronic part by means of a machine in the same way that electronic parts are set on a printed circuit board, automatic mounting of the heat conductor also can be carried out.

Since heat conductive fillers are dispersed in both of the heat conductive layer and the potentially adhesive layer, both layers show high heat conductivity. When the heat conductor of the invention abuts on a heat sink while adhering to the electronic parts, the heat conductor closely contacts with the heat sink owing to softness of the heat conductive layer, and thus conducts the heat from the electronic parts to the heat sink effectively. As a result, the heat in the electronic parts is dissipated efficiently from the heat sink to the outside atmosphere.

When a hot melt material is used for the aforementioned potentially adhesive layer, in the manufacturing process of the heat conductor of the invention, such a work as to coat heat conductive layer with a molten hot melt material is required. However, it is difficult for a relatively soft heat conductive layer to be coated with a molten hot melt material. In these circumstances, the following may be employed for the heat conductor of the invention. The heat conductor consists of a potentially adhesive layer formed on only one side of a heat resistant film by coating it with a molten hot melt material, having a heat conductive filler dispersed therein, with a heat conductive layer adhered to the other side of the heat resistant film from the potentially adhesive layer. In the heat conductor of such construction, for example, a potentially adhesive layer is firstly formed by coating one side of a heat resistant film with a molten hot melt material and then the heat conductor is formed by applying a heat conductive layer to the other side of the heat resistant film. A heat resistant film such as a polyimide film is stiffer than the heat conductive layer and, therefore, the aforementioned work of coating a hot melt material is easier. As a result, the manufacturing of the heat conductor of the invention is facilitated.

The heat conductive layer is formed by using a soft base material, in order that the heat conductor of the invention may be adhered to electronic parts in close contact with a heat sink. As such a layer tends to be easily broken, it is preferable to provide a glass cloth layer inside or on the surface of the heat conductive layer. By means of the glass cloth layer, the strength of the heat conductive layer is increased and the heat conductive layer is prevented from being broken.

The heat conductor of the invention is set on tentatively secured electronic parts and made to adhere to the electronic parts by heating from the outside by, such as reflow soldering. However, the heat conductor may possibly be displaced or dropped out from the electronic parts due to oscillation and the like before being adhered. Therefore, in a further aspect of the invention, a small hole running from the potentially adhesive surface to the heat conductive layer is provided in the potentially adhesive layer, when the base material composing the heat conductive layer is adhesive. Here, one example of such an adhesive base material is a gel-like material, which usually shows some adhesiveness depending on included liquidous components therein. When the heat conductor of the form of the invention is set on electronic parts, if a load is applied to the heat conductive layer, a portion of the heat conductive layer including soft base material protrudes through the small hole and due to the adhesiveness of the heat conductive layer, the heat conductor can be secured tentatively at predetermined positions on the electric parts by means of adhesion of the heat conductive layer protruding from the small hole. As a result, displacement of the heat conductor can be prevented from occurring after it is set on the electronic parts until it is permanently adhered thereto. The small hole may be provided at any suitable position on the potentially adhesive surface, that is, the position is not specifically limited. It is naturally possible to provide a plurality of holes.

BRIEF DESCRIPTION OF DRAWING FIGURES

The invention will now be described, by way of example, with reference to the accompanying drawings, in which.

DETAILED DESCRIPTION OF THE PREFERRED EMBODIMENTS

Preferred embodiments of the invention will be described referring to drawing figures as follows.

Figure 1:
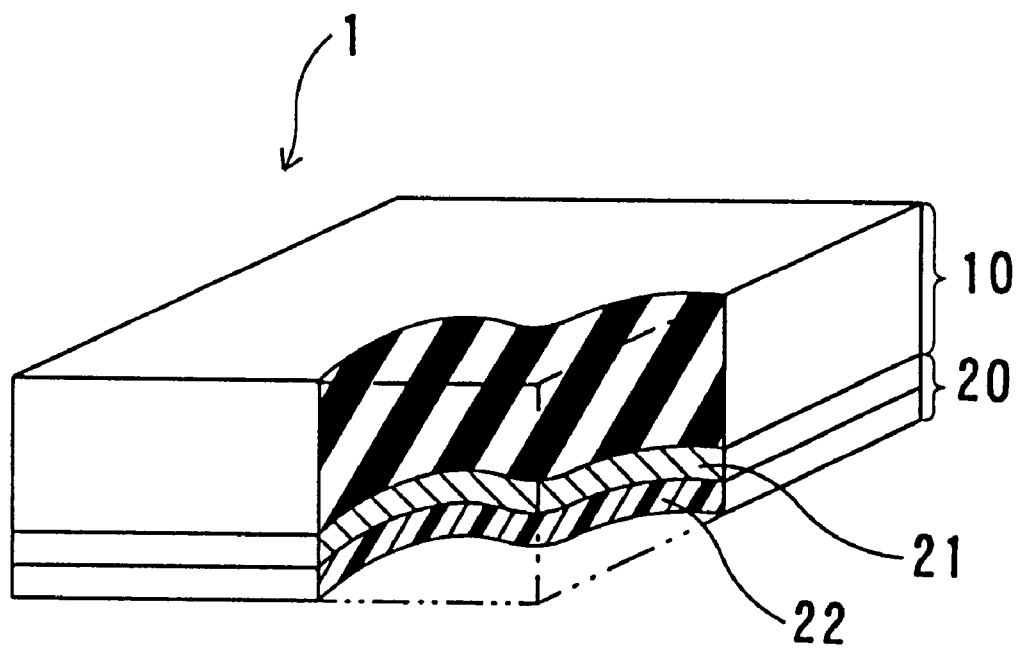
FIG. 1 is a perspective view of a heat conductor according to a first embodiment of the present invention.

In FIG. 1, a portion of a heat conductor 1 is broken away to show its cross-section clearly. As shown in FIG. 1, in the heat conductor 1 of the first embodiment, a heat conductive layer 10 and a potentially adhesive layer 20 are disposed integrally. The potentially adhesive layer 20 is formed by a heat resistant film 21 and a hot melt layer 22. The heat resistant film 21 is adhered to the aforementioned heat conductive layer 10.

Figure 3A:
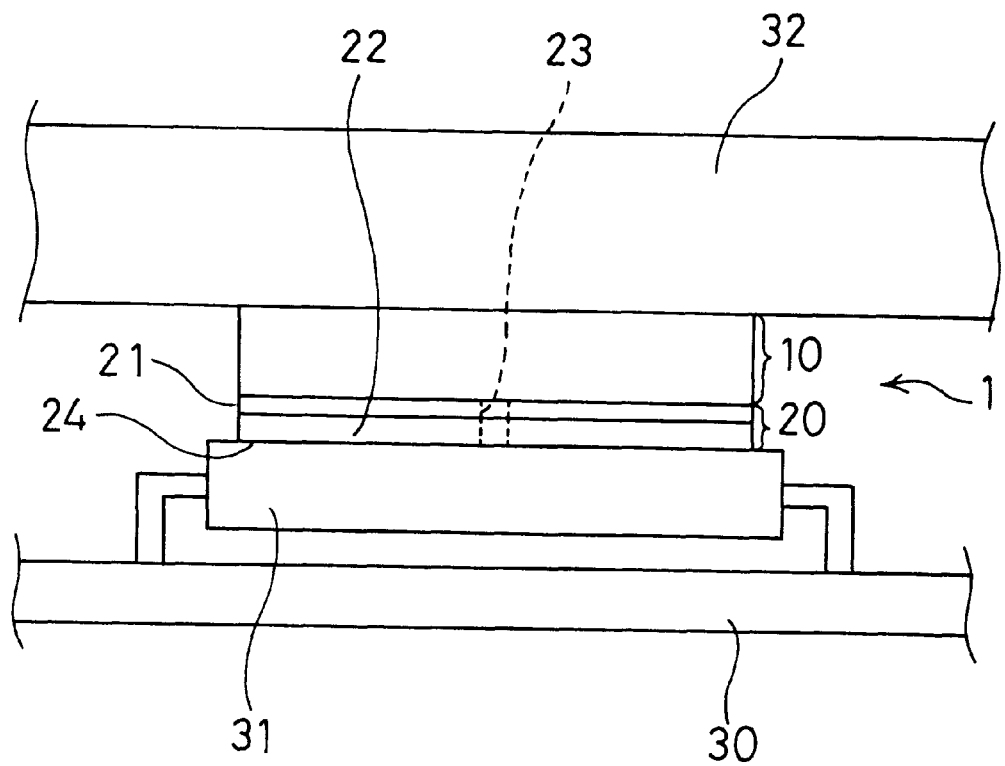
FIG. 3A is a side view showing a state where a heat conductor of the first embodiment is set on an electrical part.
Figure 3B:
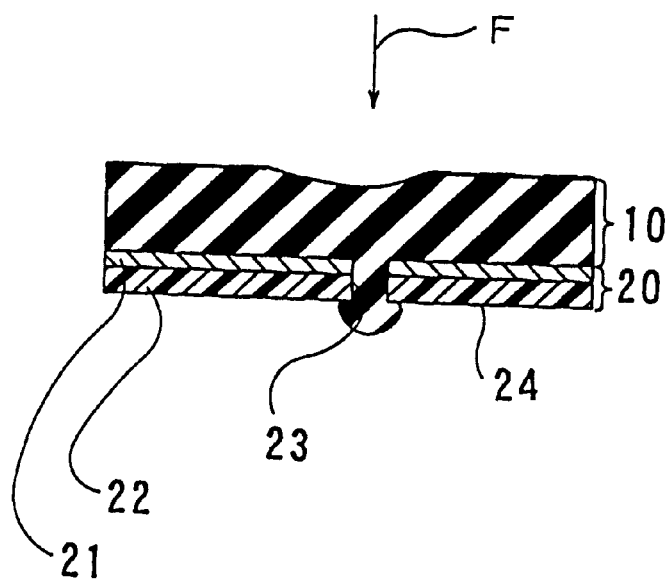
FIG. 3B is a cross-sectional view of a heat conductor of the first embodiment.

FIG. 3A shows a heat conductor 1 is set on an electronic part 31 on a print circuit board 30. FIG. 3B shows a cross section of the heat conductor 1. As it is known from FIGS. 3A and 3B, there is formed a small hole 23 which extends from a potentially adhesive surface 24, i.e. a surface opposite to the surface on which the heat conductive layer 10 is disposed, to the heat conductive layer 10. FIG. 3B shows a cross-section passing the center of the small hall 23.

First, the heat conductive layer 10 will be described.

The heat conductive layer 10 comprises a silicone gel sheet, which is formed by calendering a, liquid silicone rubber, having about 57 weight percent of alumina as a heat conductive filler dispersed therein, into a sheet with a thickness of about 1 mm and heating the sheet. The diameter of the particles of alumina used here is from about 5 $\mu$m to about 10 $\mu$m.

Silicone gel is a gel like material which is designed to lose its fluidity by having the network structure of a base polymer contain liquidous components. As a result, the heat conductive layer 10 has a visco-elasticity depending on the contained liquidous material. It also has a high heat conductivity due to the dispersed alumina therein. The diameter of the particles of alumina used here is from about 5 $\mu$m to about 10 $\mu$m.

The base polymer of layers is not limited to a silicone gel. There can be used any thermoplastic elastomer such as a polymer of the styrene family, the ester family, the amide family, the urethane family or the like, as well as a thermosetting elastomer such as a polymer of the silicone family, the urethane family, the epoxy family or the like. A thermoplastic resin such as a polymer of the styrene family, the ABS family, the olefin family or the like can also be used, as well as their rubber-modified polymer.

As the liquidous component used for the gel-like material, a substance is preferred which acts as a plasticizer or a softening agent and is liquid or liquidous at room temperature, though it is not limited to such a substance. Either of hydrophilic and hydrophobic softening agents can be used. Any softening agent for rubbers or resins including mineral oil, vegetable oil, synthetic oil and the like can be used without any limitation.

Figure 2A:
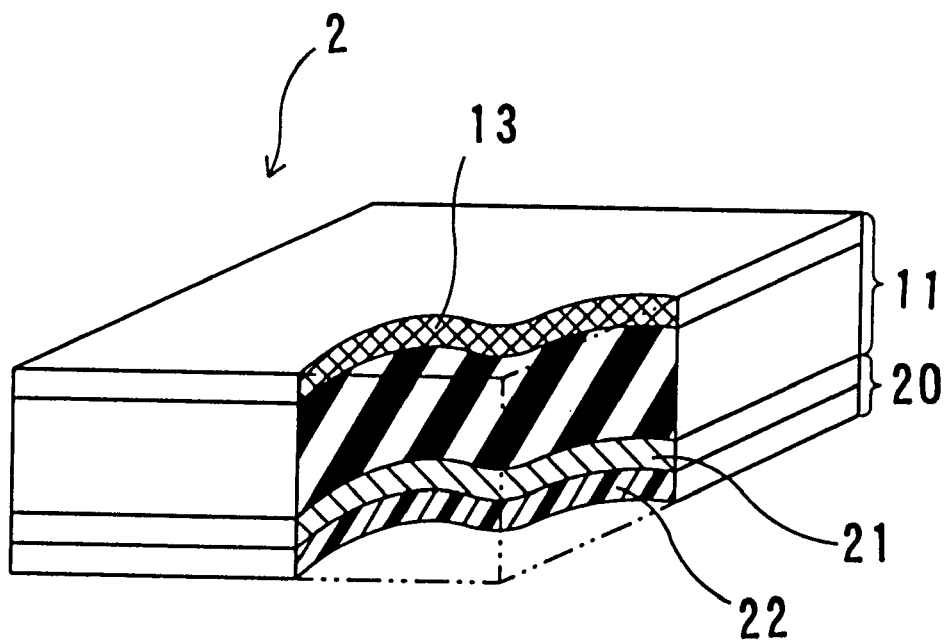
FIGS. 2A and 2B are perspective views of heat conductors according to a second and a third embodiments.
Figure 2B:
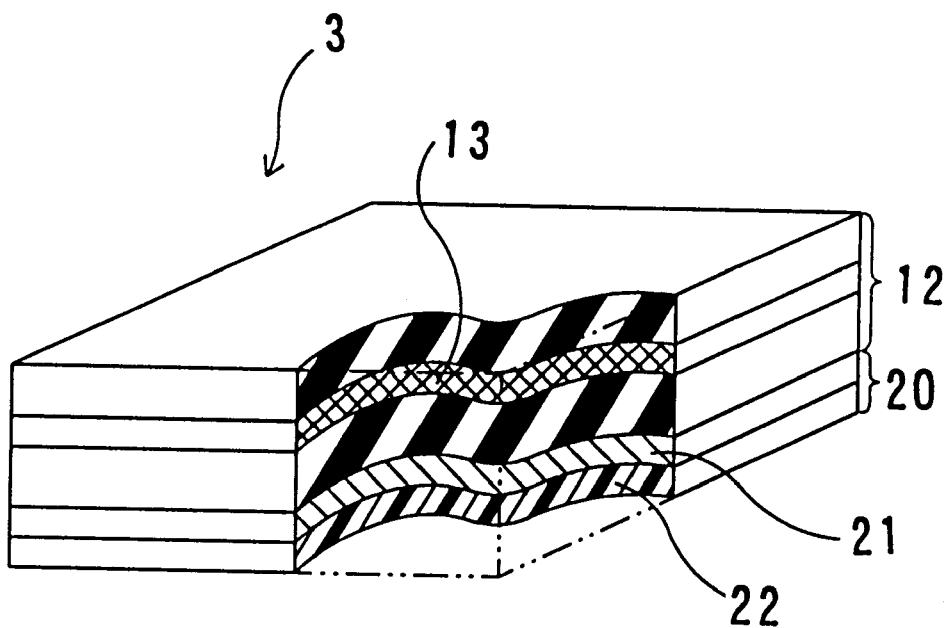

In order to prevent the heat conductor 10 from being torn, a glass cloth layer 13 may be provided as shown in the perspective views of heat conductors 2 and 3 in FIGS. 2A and 2B. In the heat conductor 2 shown in FIG. 2A, a heat conductive layer 11 is provided with a glass cloth layer 13 on its surface, and in the heat conductor 3 shown in FIG. 2B, a heat conductive layer 12 is provided with an inside glass cloth layer 13. By such construction, the relatively soft heat conductive layer 10 made of a gel-like material can be strengthened and prevented from being torn.

The heat conductive layer 10 may be formed by a base material having enough softness for closely contacting with the parts. For example, a material like rubber, gum and the like can be used to form the heat conductive layer 10, other than a gel-like material.

Such heat conductive layers 10, 11 and 12 are available, for example, according to the manufacturing methods shown in Japan Patent Publication No. 2728607 as well as in U.S. Pat. Nos. 4,602,678 or 4,685,987.

The potentially adhesive layer 20 will be described as follows.

The hot melt layer 22 of the potentially adhesive layer 20 is formed with about 55 weight percent of alumina as a heat conductive filler dispersed in a hot melt material. In this embodiment, an ethylene-vinyl acetate copolymer of the olefine family is used as the hot melt material. However, this material is not limited to this polymer. For example, polystyrene resin of the rubber family (SEBS, SIS, SEPS) and ethylene-acrylic acid ester copolymer, amorphous PP/ethylene random copolymer and ethylene-α olefine copolymer of the olefine family can be used, as well as a polymer of the ester family, the amide family or the parafine family.

For the heat resistant film 21 of the potentially adhesive layer 20, a polyimide film is used.

Also in this embodiment, fine particles of alumina are dispersed as the heat conductive filler in the aforementioned heat conductive layer 10 and the hot melt layer 22 of the potentially adhesive layer 20. Aluminum hydroxide, SiC, beryllium oxide, aluminum nitride, boron nitride and the like are alternatives to alumina.

Such a heat conductor 1 is prepared by the following method in the embodiments.

First, a heat resistant film 21 is coated with a molten hot melt material to form a potentially adhesive layer 20 with a thickness of about 0.4 mm consisting of the heat resistant film 21 and the hot melt layer 22. Subsequently, the heat conductive layer 10 with a thickness of about 1 mm and the heat resistant film 21 of the potentially adhesive layer 20 are laminated with an adhesive agent. As shown in FIG. 3A, a small hole 23 running from the potentially adhesive surface 24 to the heat conducting layer 10 is made at about the center of the potentially adhesive layer 20, and thus, the heat conductor 1 of FIG. 1 is obtained.

An effect of the embodiment will be described as follows.

The heat conductor 1 of the embodiment is provided with the heat conductive layer 10 and the potentially adhesive layer 20. By a phase change of the hot melt layer 22 of the potentially adhesive layer 20, that is, by solidifying of the layer 22 after having been molten by heating from the outside, the heat conductive layer 10 adheres, via the potentially adhesive layer 20, to the electronic part abutted by the potentially adhesive layer 20.

Therefore, as shown in FIG. 3A, when the heat conductor 1 is set in such a way that the potentially adhesive layer 20 abuts electronic parts 31 tentatively secured, for example, to a printed circuit board 30 before heating by reflow soldering and the like, the heat conductor 1 of the embodiment is made to adhere to the electronic parts 31 while the electronic parts 31 are soldered by reflow soldering. In short, the heat conductor 1 of this embodiment can be automatically mounted by setting it on each electronic part 31 with a machine in the same way that the electronic parts 31 are set on the printed circuit board 30.

Heat conductors 1 of this embodiment may be set on a ceramic package IC or a plastic package IC, and heated at 200° C. for 10 seconds after having been preheated at 150° C. for 40 seconds with a reflow test machine. As a result, the heat conductors 1 are firmly adhered to the ICs.

The heat conductive layer 10 and the hot melt layer 22 of the potentially adhesive layer 20 has a high heat conductivity as a result of the alumina dispersed in these layers. The heat conductor 1 of this embodiment shows a heat conductivity of 0.7 W/m·K. Thereby, when the heat conductor 1 abuts to a heat sink 32 while adhered to the electronic part 31, the heat from the electronic part 31 is effectively conducted to the heat sink. As a result, the heat from the electronic part 31 is effectively dissipated from the heat sink to the outside atmosphere.

When the heat conductor 1 is set on the electronic part 31 tentatively secured to the printed circuit board 30, if a load, as shown by notation F in FIG. 3B, is exerted on the heat conductor 1, a portion of the heat conductive layer 10, made of the relatively soft silicone gel, protrudes through the small hole 23 toward the side of the potentially adhesive surface 24 and is thereby secured tentatively on the electronic part 31.

The invention is not limited to the embodiment of FIG. 1 and can be embodied by various modifications within the scope of the invention.

For example, in the aforementioned embodiment, alumina of about 57 weight percent is dispersed in the heat conductive layer 10 and alumina of about 55 weight percent is dispersed in the hot melt layer 22. Since it is preferable for accelerating heat dissipation that the heat conductor 1, which consists of the heat conductive layer 10 and the potentially adhesive layer 20 having the hot melt layer 22, has heat conductivity of at least about 0.5 W/m·K, heat conductive fillers of about 45 to about 80 weight percent may be dispersed in the heat conductive layer 10 and the hot melt layer 22 of the potentially adhesive layer 20.

Figure 4:
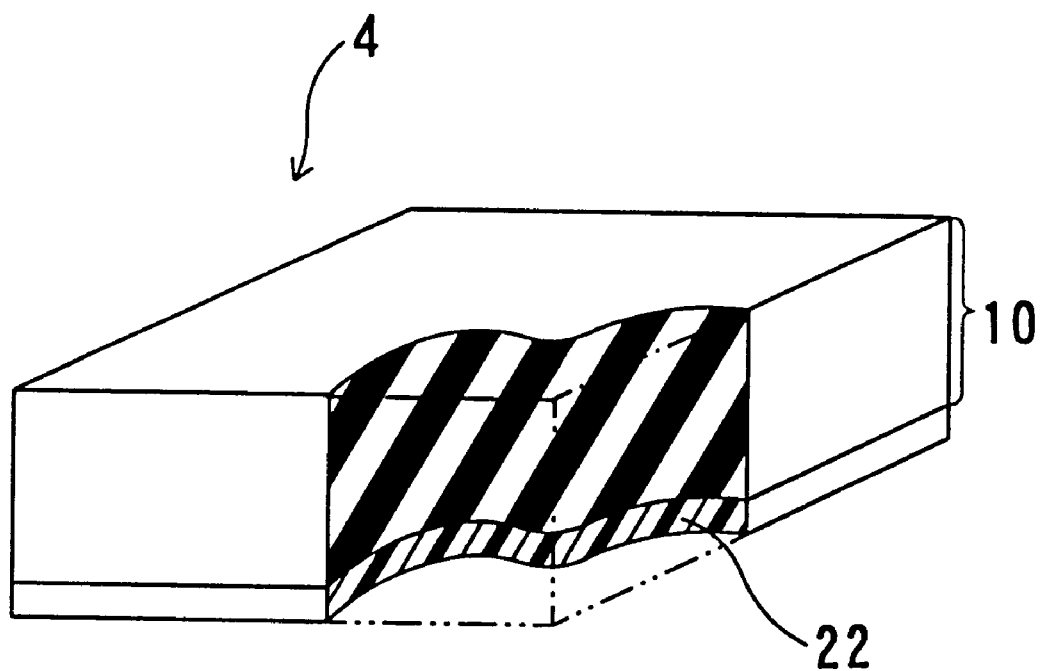
FIG. 4 is a perspective view of a heat conductor according to a fourth embodiment.

In the aforementioned embodiment, the manufacturing is made easy by using a heat resistant film 21, but the potentially adhesive layer 20 may be formed only by the hot melt layer 22, without using the heat resistant film 21. Specifically, as shown in the heat conductor 4 of the FIG. 4, the hot melt layer 22 may be directly disposed over the heat conductive layer 10.

Furthermore, though in the aforementioned embodiment, a single small hole 23 is made in the potentially adhesive layer 20, a plurality of small holes may be provided. For example, four small holes may be provided at four corners of a rectangular potentially adhesive surface 24.

What is claimed is:

1. A heat conductor for use disposed between electronic parts mounted on a printed circuit board and a heat sink, said heat conductor comprising:

a heat conductive layer having a heat conductive filler dispersed in a base material which has a softness to enable intimate contact with parts to be abutted; and a potentially adhesive layer having a heat conductive filler dispersed therein, said potentially adhesive layer is disposed in intimate contact with said heat conductive layer and arranged to have a phase change to heating from an outside source during mounting of the electronic parts on the printed circuit board, to adhere the heat conductor to the electronic parts.

2. The heat conductor according to claim 1, wherein said potentially adhesive layer comprises: a hot melt layer made of a hot melt material, said hot melt material having a heat conductive filler dispersed therein; and a heat resistant film; said heat resistant film having a face disposed on said hot melt layer and an opposite face of said heat resistant film is adhered to said heat conductive layer.

3. The heat conductor according to claim 1, comprising a glass cloth layer disposed on a surface of said heat conductive layer.

4. The heat conductor according to claim 1, wherein said potentially adhesive layer is provided with a hole extending therethrough from said heat conductive layer to said electronic part during mounting.

5. The heat conductor of claim 1, wherein the potentially adhesive layer has a phase change temperature of about 100° C. to about 150° C.

6. The heat conductor of claim 2, wherein the heat conductive filler comprises from about 45 to about 80 weight percent of the heat conductive and potentially adhesive layers.

7. The heat conductor of claim 6, wherein the heat conductive filler is alumina.

8. The heat conductor according to claim 1, comprising a glass cloth layer disposed within of said heat conductive layer.

* * * * *